(12) United States Patent
Chung et al.

(10) Patent No.: US 12,094,905 B2
(45) Date of Patent: Sep. 17, 2024

(54) IMAGE SENSOR AND MANUFACTURING METHOD THEREOF

(71) Applicant: Powerchip Semiconductor Manufacturing Corporation, Hsinchu (TW)

(72) Inventors: Chih-Ping Chung, Hsinchu (TW); Ming-Yu Ho, Taichung (TW); Saysamone Pittikoun, Hsinchu County (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 415 days.

(21) Appl. No.: 17/700,516

(22) Filed: Mar. 22, 2022

(65) Prior Publication Data
US 2023/0223417 A1 Jul. 13, 2023

(30) Foreign Application Priority Data
Jan. 11, 2022 (TW) .................................. 111101099

(51) Int. Cl.
*H01L 27/146* (2006.01)
(52) U.S. Cl.
CPC .... *H01L 27/1463* (2013.01); *H01L 27/14621* (2013.01); *H01L 27/14623* (2013.01);
(Continued)
(58) Field of Classification Search
None
See application file for complete search history.

(56) References Cited

U.S. PATENT DOCUMENTS

| 6,838,301 B2 | 1/2005 | Zheng et al. |
| 8,101,978 B2 | 1/2012 | Dai et al. |

(Continued)

FOREIGN PATENT DOCUMENTS

| TW | 703716 | 9/2020 |
| TW | 202034536 | 9/2020 |

OTHER PUBLICATIONS

Jerome Baron et al., "Back-side illumination, wafer-scale optics drive 2X-5X jump in CMOS image sensor performance", May 2010, Available at: https://www.researchgate.net/publication/265155213.

(Continued)

*Primary Examiner* — Cory W Eskridge
(74) *Attorney, Agent, or Firm* — JCIPRNET (57) ABSTRACT

Provided are an image sensor and a manufacturing method thereof. In the image sensor, an insulating layer and a first silicon layer are sequentially on a silicon base. A first isolation structure is in the first silicon layer to define an active area (AA). A doped region is in a part of the first silicon layer in the AA and in a part of the silicon base thereunder. A second silicon layer is in a part of the first silicon layer in the AA and extends into the silicon base. An interconnection structure is on the first silicon layer and electrically connected with a transistor. A second isolation structure is in the silicon base under the first isolation structure and connected to the insulating layer. A passivation layer surrounds the silicon base and is connected to the doped region. A microlens is on the silicon base.

20 Claims, 8 Drawing Sheets

(52) U.S. Cl.
CPC .. *H01L 27/14627* (2013.01); *H01L 27/14636* (2013.01); *H01L 27/14685* (2013.01)

(56) References Cited

U.S. PATENT DOCUMENTS

| | | |
|---|---|---|
| 9,431,452 B1 | 8/2016 | Liu et al. |
| 2015/0221692 A1* | 8/2015 | Enomoto .......... H01L 27/14612 438/73 |
| 2020/0219914 A1 | 7/2020 | Kim et al. |

OTHER PUBLICATIONS

"Office Action of Taiwan Counterpart Application", issued on Sep. 21, 2022, pp. 1-4.

* cited by examiner

IMAGE SENSOR AND MANUFACTURING METHOD THEREOF

CROSS-REFERENCE TO RELATED APPLICATION

This application claims the priority benefit of Taiwan application serial no. 111101099, filed on Jan. 11, 2022. The entirety of the above-mentioned patent application is hereby incorporated by reference herein and made a part of this specification.

BACKGROUND

Technical Field

The present invention relates to a semiconductor device and a manufacturing method thereof, and particularly to an image sensor and a manufacturing method thereof.

Description of Related Art

With the continuous development and growth of digital cameras, electronic scanners and other products, the demand for image sensing devices in the market continues to increase. Currently, commonly used image sensing devices include two categories: the charge coupled device (CCD) and the complementary metal-oxide-semiconductor image sensor (CMOS image sensor, CIS). The CMOS image sensor has the advantages of low operating voltage, low power consumption, high operating efficiency, random access according to needs, etc., and can be integrated into the current semiconductor technology for mass production, so the CMOS image sensor has a wide range of applications.

In order to avoid the deformation of images of high-speed moving objects, a global shutter (GS) image sensor is developed, which mainly includes a transistor and a photodiode (PD).

When light from the outside enters the image sensor, the pixel performance of the image sensor is affected by the amount of light entering the photodiode. In addition, the electrical signals between adjacent photodiodes are easily affected due to optical interference. As a result, the performance of the image sensor is affected.

SUMMARY

The present invention provides an image sensor, in which a photodiode has a large light-receiving area, and the image sensor may have a smaller parasitic capacitance due to the use of a silicon-on-insulator (SOI) substrate.

The present invention provides a manufacturing method of an image sensor, which is used to form the above-mentioned image sensor.

An image sensor of the present invention includes a silicon base of a first conductive type having a first surface and a second surface opposite to each other, an insulating layer, a first silicon layer, a first isolation structure, a first doped region of a second conductive type, a second silicon layer of the first conductive type, a transistor, an interconnect structure, a second isolation structure, a passivation layer and a microlens. The insulating layer is disposed on the first surface of the silicon base. The first silicon layer is disposed on the insulating layer. The first isolation structure is disposed in the first silicon layer to define a first active area. The first doped region is disposed in a part of the first silicon layer in the first active area and in a part of the silicon base thereunder. The second silicon layer is disposed in a part of the first silicon layer in the first active region except the first doped region, and extending through the insulating layer into the silicon base. The transistor is disposed on the first silicon layer in the first active area. The interconnect structure is disposed on the first silicon layer and electrically connected with the transistor. The second isolation structure is disposed in the silicon base under the first isolation structure and connected to the insulating layer. The passivation layer is disposed between the silicon base and the second isolation structure, surrounding the silicon base, and connected to the first doped region. The microlens is disposed on the second surface of the silicon base.

In an embodiment of the image sensor of the present invention, the bottom surface of the second silicon layer is not lower than the bottom surface of the first doped region in the silicon base.

In an embodiment of the image sensor of the present invention, the image sensor further includes a second doped region of the second conductive type. The second doped region is disposed at the surface of the second silicon layer.

In an embodiment of the image sensor of the present invention, the passivation layer comprises a third doped region of the second conductive type.

In an embodiment of the image sensor of the present invention, the passivation layer comprises an aluminum oxide layer, a hafnium oxide layer or a combination thereof.

In an embodiment of the image sensor of the present invention, the image sensor further includes an antireflection layer and a color filter layer. The antireflection layer is disposed between the silicon base and the microlens. The color filter layer is disposed between the antireflection layer and the microlens.

In an embodiment of the image sensor of the present invention, the image sensor further includes a shielding layer. The shielding layer is disposed between the silicon base and the microlens, and partially overlapped with the silicon base.

In an embodiment of the image sensor of the present invention, the interconnect structure includes a dielectric layer and a circuit structure. The dielectric layer is disposed on the first silicon layer and covers the transistor and the first isolation structure. The circuit structure is disposed in the dielectric layer and electrically connected with the transistor.

In an embodiment of the image sensor of the present invention, the first isolation structure further defines a second active area, and the image sensor further includes: a fourth doped region of the second conductive type, a third silicon layer of the second conductive type and a third isolation structure. The fourth doped region is disposed in a part of the silicon base under the second active area. The third silicon layer is disposed in the first silicon layer in the second active area and extends through the insulating layer to be connected to the fourth doped region, wherein the bottom surface of the third silicon layer is not lower than the bottom surface of the fourth doped region in the silicon base. The third isolation structure is disposed in the silicon base under the first isolation structure defining the second active area, and connected to the insulating layer. The passivation layer is further disposed between the silicon base and the third isolation structure, surrounds the silicon base, and is connected to the fourth doped region.

In an embodiment of the image sensor of the present invention, the interconnect structure is further electrically connected to the third silicon layer.

A manufacturing method of an image sensor of the present invention includes the following steps. A semiconductor substrate is provided, wherein the semiconductor substrate comprises a silicon base of a first conductive type having a first surface and a second surface opposite to each other, an insulating layer on the first surface and a first silicon layer on the insulating layer. A first doped region of a second conductive type is formed in a part of the first silicon layer and in a part of the silicon base thereunder. A first isolation structure is formed in the first silicon layer to define a first active area, wherein the first doped region in the first silicon layer is located in the first active area. A second silicon layer of the first conductive type is formed in a part of the first silicon layer in the first active region except the first doped region, wherein the second silicon layer extends through the insulating layer into the silicon base. A transistor is formed on the first silicon layer in the first active area. An interconnect structure is formed on the first silicon layer, wherein the interconnect structure is electrically connected with the transistor. A second isolation structure is formed in the silicon base under the first isolation structure, wherein the second isolation structure is connected to the insulating layer. A passivation layer is formed between the silicon base and the second isolation structure, wherein the passivation layer surrounds the silicon base and is connected to the first doped region. A microlens is formed on the second surface of the silicon base.

In an embodiment of the manufacturing method of the image sensor of the present invention, the bottom surface of the second silicon layer is not lower than the bottom surface of the first doped region in the silicon base.

In an embodiment of the manufacturing method of the image sensor of the present invention, the method further includes the following step. A second doped region of the second conductive type is formed at the surface of the second silicon layer after forming the second silicon layer and before forming the transistor.

In an embodiment of the manufacturing method of the image sensor of the present invention, the passivation layer comprises a third doped region of the second conductive type.

In an embodiment of the manufacturing method of the image sensor of the present invention, the passivation layer comprises an aluminum oxide layer, a hafnium oxide layer or a combination thereof.

In an embodiment of the manufacturing method of the image sensor of the present invention, the method further includes the following steps after forming the passivation layer and before forming the microlens. An antireflection layer is formed on the second surface of the silicon base. A color filter layer is formed on the antireflection layer.

In an embodiment of the manufacturing method of the image sensor of the present invention, the method further includes the following step after forming the passivation layer and before forming the microlens. A shielding layer is formed on the second surface of the silicon base, wherein the shielding layer is partially overlapped with the silicon base.

In an embodiment of the manufacturing method of the image sensor of the present invention, the first isolation structure further defines a second active area, and the method further includes the following steps. A fourth doped region of the second conductive type is formed in a part of the silicon base under the second active area. A third silicon layer of the second conductive type is formed in the first silicon layer in the second active area, wherein the third silicon layer extends through the insulating layer to connect to the fourth doped region, and the bottom surface of the third silicon layer is not lower than the bottom surface of the fourth doped region in the silicon base. A third isolation structure is formed in the silicon base under the first isolation structure defining the second active area, wherein the third isolation structure is connected to the insulating layer. The passivation layer is further formed between the silicon base and the third isolation structure, surrounds the silicon base, and is connected to the fourth doped region.

In an embodiment of the manufacturing method of the image sensor of the present invention, the interconnect structure is further electrically connected with the third silicon layer.

In an embodiment of the manufacturing method of the image sensor of the present invention, the method further includes the following step after forming the interconnect structure and before forming the second isolation structure and the passivation layer. the silicon base is thinned.

Based on the above, in the image sensor of the present invention, the photodiode may be composed of the silicon base of the first conductive type of the semiconductor substrate and the doped region of the second conductive type in the silicon base. Therefore, the photodiode may have a relatively large light-receiving area and a high potential well capacity (FWC). In addition, in the present invention, the image sensor is manufactured by using a silicon-on-insulator substrate, and thus may have a small parasitic capacitance, so that the photodiode may have a high conversion gain. In this way, the image sensor of the present invention may have better pixel performance.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

The embodiments are described in detail under with reference to the accompanying drawings, but the embodiments are not intended to limit the scope of the present invention. In addition, the drawings are for illustrative purposes only and are not drawn to the original dimensions. For the sake of easy understanding, the same elements in the following description will be denoted by the same reference numerals.

In the text, the terms mentioned in the text, such as "comprising", "including", "containing" and "having" are all open-ended terms, i.e., meaning "including but not limited to".

In addition, directional terms such as "on" and "under" mentioned herein are only used to refer to the directions of the drawings and are not used to limit the disclosure. Therefore, it should be understood that "on" may be used interchangeably with "under", and when an element such as a layer or a film is placed "on" another element, the element may be directly placed on the other element or there may be an intermediate element. On the other hand, when an element is described to be placed "directly" on another element, there is no intermediate element between the two.

When using terms such as "first" and "second" to describe elements, it is only used to distinguish the elements from each other, and does not limit the order or importance of the devices. Therefore, in some cases, the first element may also be called the second element, the second element may also be called the first element, and this is not beyond the scope of the present invention.

In addition, the directional terms mentioned in the text, such as "upper", "lower", etc., are only used to refer to the direction of the drawings, and are not used to limit the present invention. Thus, it should be understood that "on" is used interchangeably with "under" and that when a device such as a layer or film is placed "on" another device, the device may be placed directly on the other device, or may be present Intermediate device. On the other hand, when a device is said to be "directly" placed "on" another device, there is no intermediate device between the two.

FIGS. 1A to 1H are schematic cross-sectional views illustrating a manufacturing process of an image sensor according to an embodiment of the present invention. In the present embodiment, the first conductive type is one of the P-type and the N-type, and the second conductive type is the other of the P-type and the N-type.

Figure 1A:
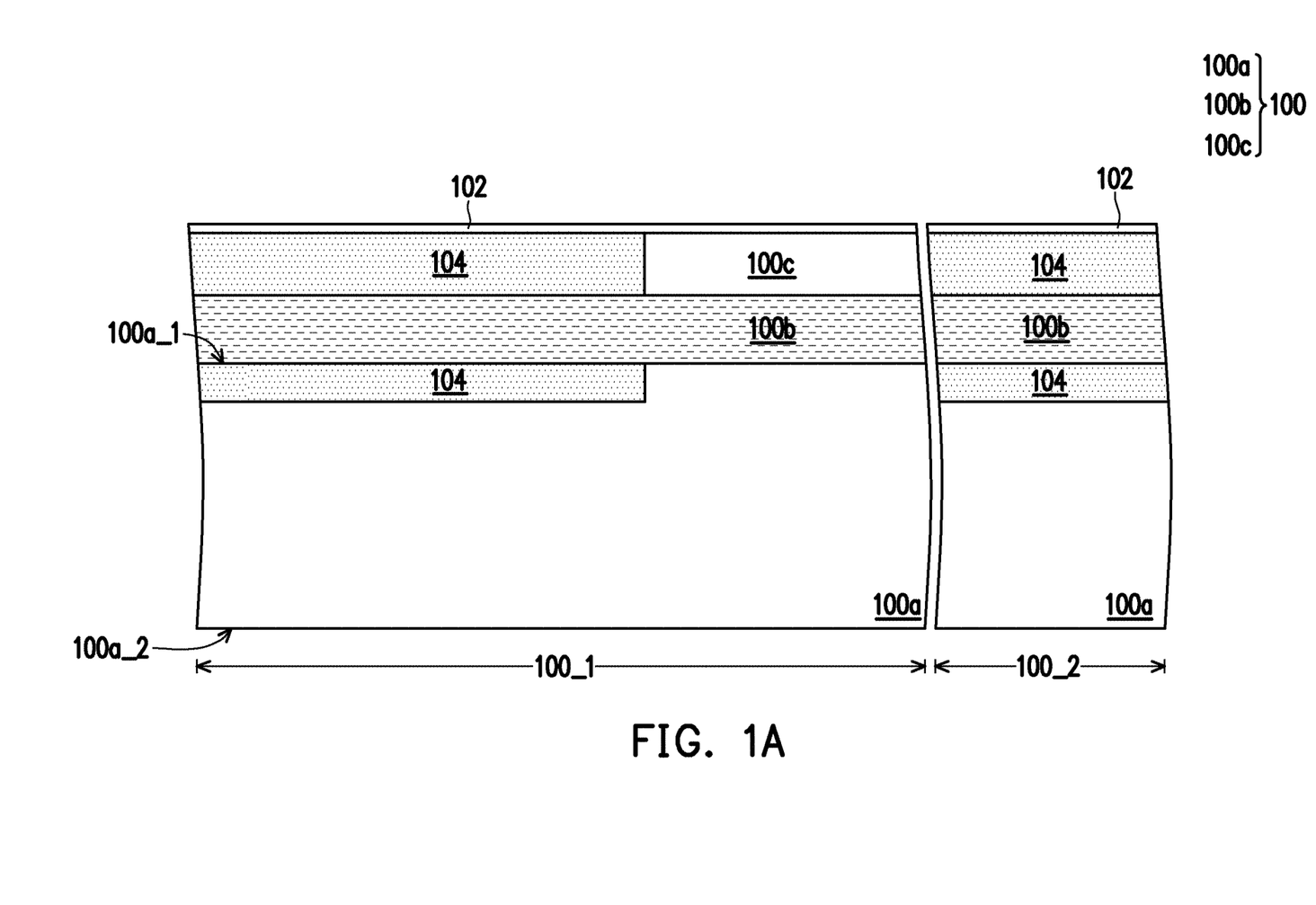
FIGS. 1A to 1H are schematic cross-sectional views illustrating a manufacturing process of an image sensor according to an embodiment of the present invention.

Referring to FIG. 1A, the semiconductor substrate 100 is provided. The semiconductor substrate 100 has a first region 100_1 and a second region 100_2. In the present embodiment, the first region 100_1 and the second region 100_2 are different regions in a pixel region. In the present embodiment, the semiconductor substrate 100 includes the silicon base 100a, the insulating layer 100b and the first silicon layer 100c. The silicon base 100a has the first conductive type. In the present embodiment, the silicon base 100a is, for example, an epitaxial silicon base, but the present invention is not limited thereto. The silicon base 100a has a first surface 100a_1 and a second surface 100a_2 opposite to each other. The insulating layer 100b is disposed on the first surface 100a_1 of the silicon base 100a. In the present embodiment, the insulating layer 100b is, for example, a silicon oxide layer, but the present invention is not limited thereto. The thickness of the insulating layer 100b is, for example, between 100 nm and 200 nm. The first silicon layer 100c is disposed on the insulating layer 100b. The thickness of the first silicon layer 100c is, for example, between 70 nm and 3 μm. In other words, in the present embodiment, the semiconductor substrate 100 is a commonly known silicon-on-insulator (SOI) substrate.

The silicon oxide layer 102 may be optionally formed on the first silicon layer 100c. The forming method of the silicon oxide layer 102 is, for example, a chemical vapor deposition (CVD) process. After that, an ion implantation process may be performed to implant the dopant of the second conductive type into the first silicon layer 100c and the silicon base 100a. In the present embodiment, since the silicon oxide layer 102 is formed on the first silicon layer 100c, a channeling effect caused by ion implantation may be avoided. In other embodiments, the silicon oxide layer 102 may be omitted and the channel effect may be prevented by adjusting the ion implantation angle. In this way, the doped region 104 of the second conductive type is formed. The doped region 104 is located in a part of the first silicon layer 100c and a part of the silicon base 100a thereunder. The detailed forming steps of the doped region 104 are well known to those skilled in the art and are not further described herein.

Figure 1B:
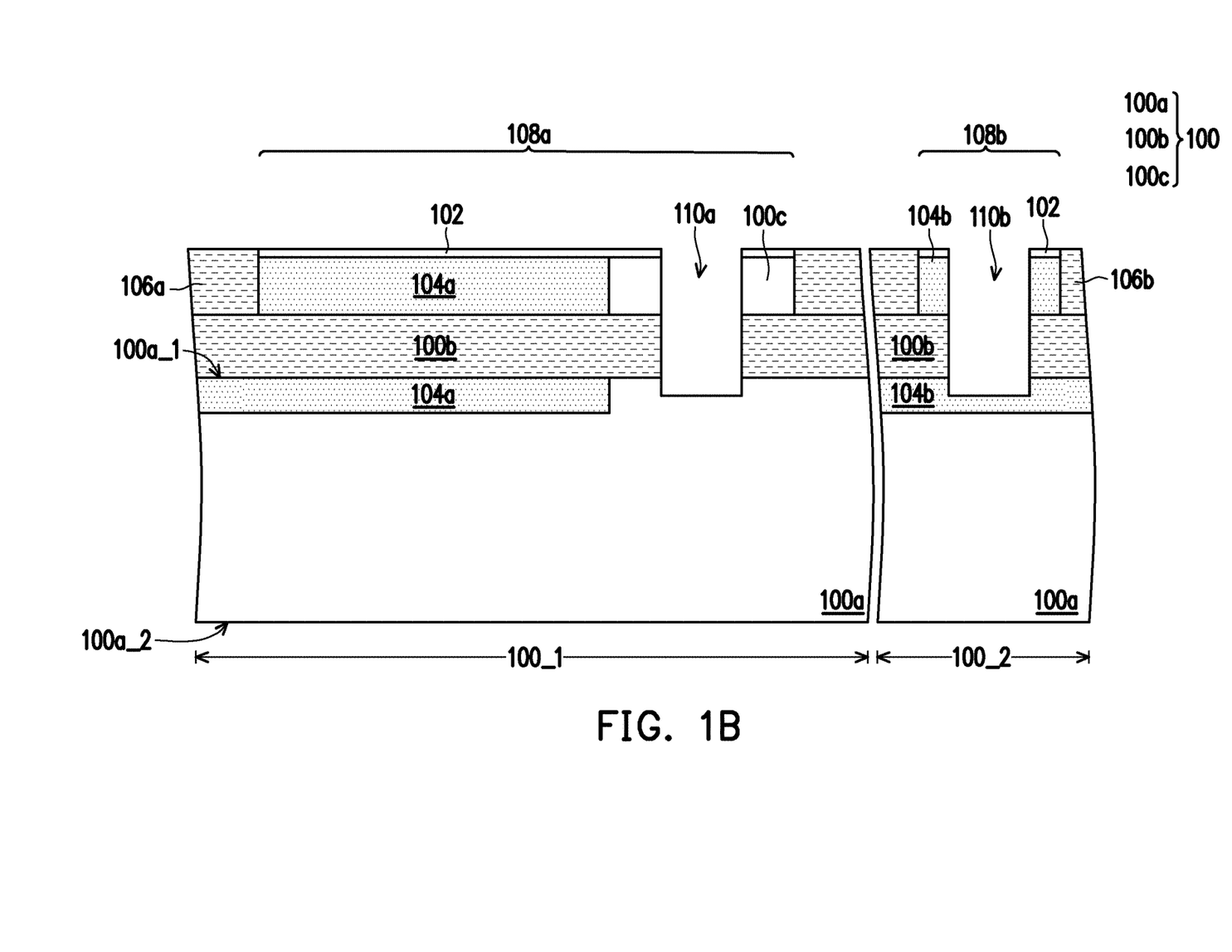

Referring to FIG. 1B, the isolation structure 106a and the isolation structure 106b are formed in the first silicon layer 100c. In the present embodiment, the isolation structure 106a and the isolation structure 106b are shallow trench isolation (STI) structures. The isolation structure 106a defines the first active area 108a, and the isolation structure 106b defines the second active area 108b, so that the doped region 104 may be divided into a doped region 104a located in the first active area 108a and a doped region 104b located in the second active area 108b. In the first active area 108a, the doped region 104a is located in a part of the first silicon layer 100c. In the second active area 108b, the doping 104b is located in the entire first silicon layer 100c.

In the present embodiment, the thickness of the isolation structure 106a and the isolation structure 106b is the same as the thickness of the first silicon layer 100c. That is, the isolation structure 106a and the isolation structure 106b penetrate through the first silicon layer 100c, so that the adjacent active areas may be effectively isolated from each other. In other embodiments, the thickness of the isolation structure 106a and the isolation structure 106b may be greater than the thickness of the first silicon layer 100c. That is, the isolation structure 106a and the isolation structure 106b penetrate through the first silicon layer 100c, and the top surfaces of the isolation structure 106a and the isolation structure 106b may be higher than the top surface of the first silicon layer 100c. The forming methods of the isolation structure 106a and the isolation structure 106b are well known to those skilled in the art, and are not further described herein.

In the present embodiment, after the doped region 104, the isolation structure 106a and the isolation structure 106b are formed, the silicon oxide layer 102 remains on the first silicon layer 100c. In other embodiments, after the doped region 104, the isolation structure 106a and the isolation structure 106b are formed, the silicon oxide layer 102 may be damaged or even consumed due to the ion implantation process and the etching process for forming the isolation structure 106a and the isolation structure 106b. Therefore, another silicon oxide layer may be additionally formed on the first silicon layer 100c.

The trench 110a is formed in the silicon oxide layer 102, the first silicon layer 100c, the insulating layer 100b and the silicon base 100a in the first active area 108a, and the trench 110b is formed in the silicon oxide layer 102, the first silicon layer 100c (the doped region 104b), the insulating layer 100b and the silicon base 100a in the second active area 108b. In the present embodiment, the bottom surface of the trench 110a is not lower than the bottom surface of the doped region 104a in the silicon base 100a, and the bottom surface of the trench 110b is not lower than the bottom surface of the doped region 104b in the silicon base 100a. In other embodiments, the trench 110a and the trench 110b may only penetrate through the insulating layer 100b to expose the first surface 100a_1 of the silicon base 100a. That is, the bottom surface of the trench 110a and the bottom surface of the trench 110b may be coplanar with the first surface 100a_1 of the silicon base 100a (the bottom surface of the insulating layer 100b).

In addition, in the present embodiment, the trench 110a and the trench 110b are formed in the same process step, so the trench 110a and the trench 110b may have the same depth, but the present invention is not limited thereto. In other embodiments, the trench 110a and the trench 110b may have different depths, as long as the bottom surface of the trench 110b is not lower than the bottom surface of the doped region 104b in the silicon base 100a.

Figure 1C:
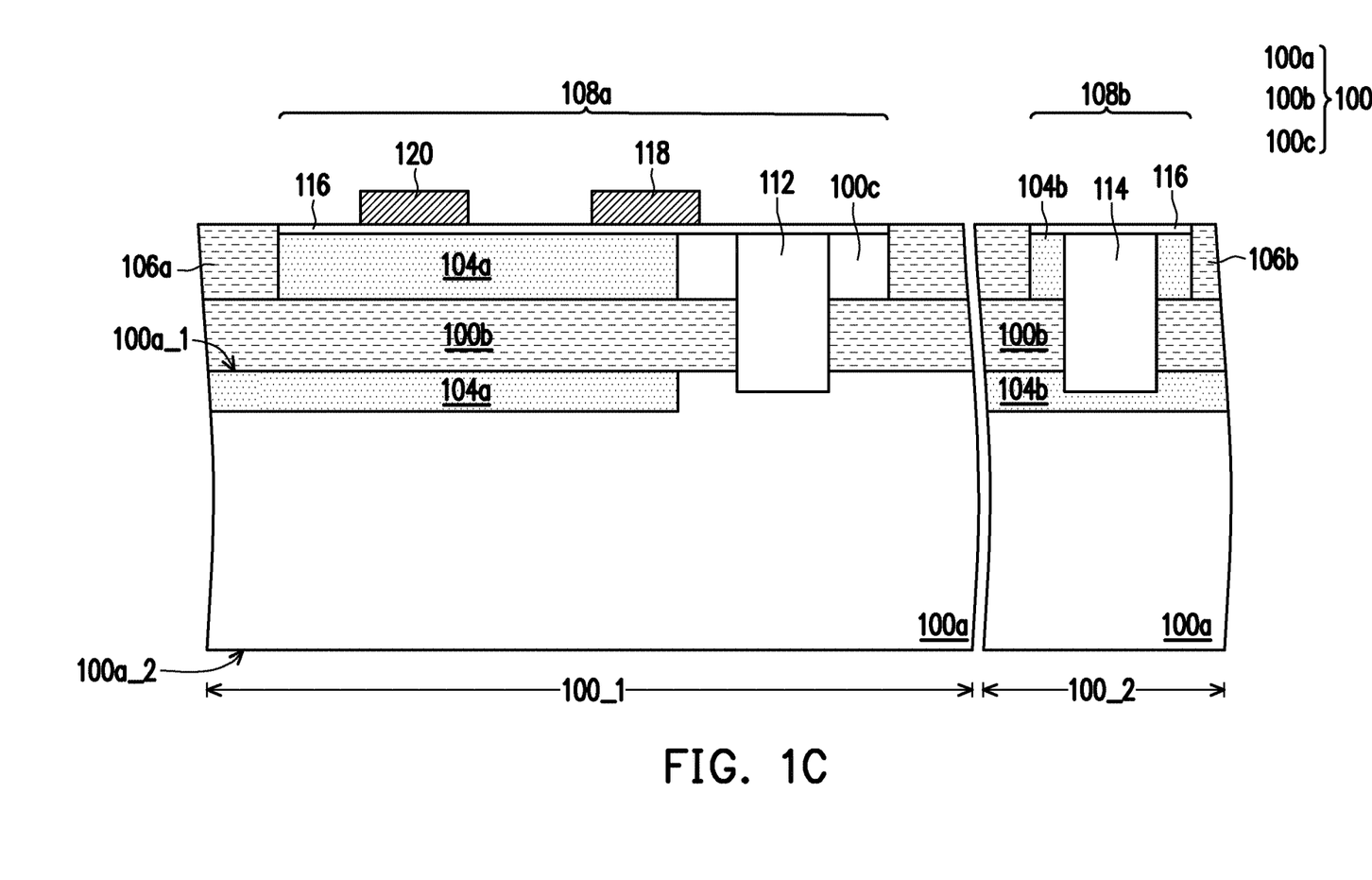

Referring to FIG. 1C, the second silicon layer 112 of the first conductive type is formed in the trench 110a, and the third silicon layer 114 of the first conductive type is formed in the trench 110b. The forming method of the second silicon layer 112 and the third silicon layer 114 is, for example, an epitaxial process or a chemical vapor deposition process, and dopant of the first conductive type is doped in-situ. In the present embodiment, the second silicon layer 112 is located in the first silicon layer 100c in the first active area 108a and extends through the insulating layer 100b into the silicon base 100a, and the third silicon layer 114 is located in the first silicon layer 100c (the doped region 104b) in the second active area 108b and extends through the insulating layer 100b into the silicon base 100a to connect with the doped region 104b in the silicon base 100a. Then, the silicon oxide layer 102 is removed. The silicon oxide layer 116 is formed on the first silicon layer 100c. The silicon oxide layer 116 is used as the gate dielectric layer of the subsequently formed transistor. The forming method of the silicon oxide layer 116 is, for example, a thermal oxidation process.

The gate 118 and the gate 120 are formed on the silicon oxide layer 116 in the first active area 108a. The material of the gate 118 and the gate 120 is, for example, doped polysilicon. The forming method of the gate 118 and the gate 120 is well known to those skilled in the art, and is not further described herein. In the present embodiment, the gate 118 may be used as a transfer gate, and the gate 120 may be used as a reset gate, but the present invention is not limited thereto.

Figure 1D:
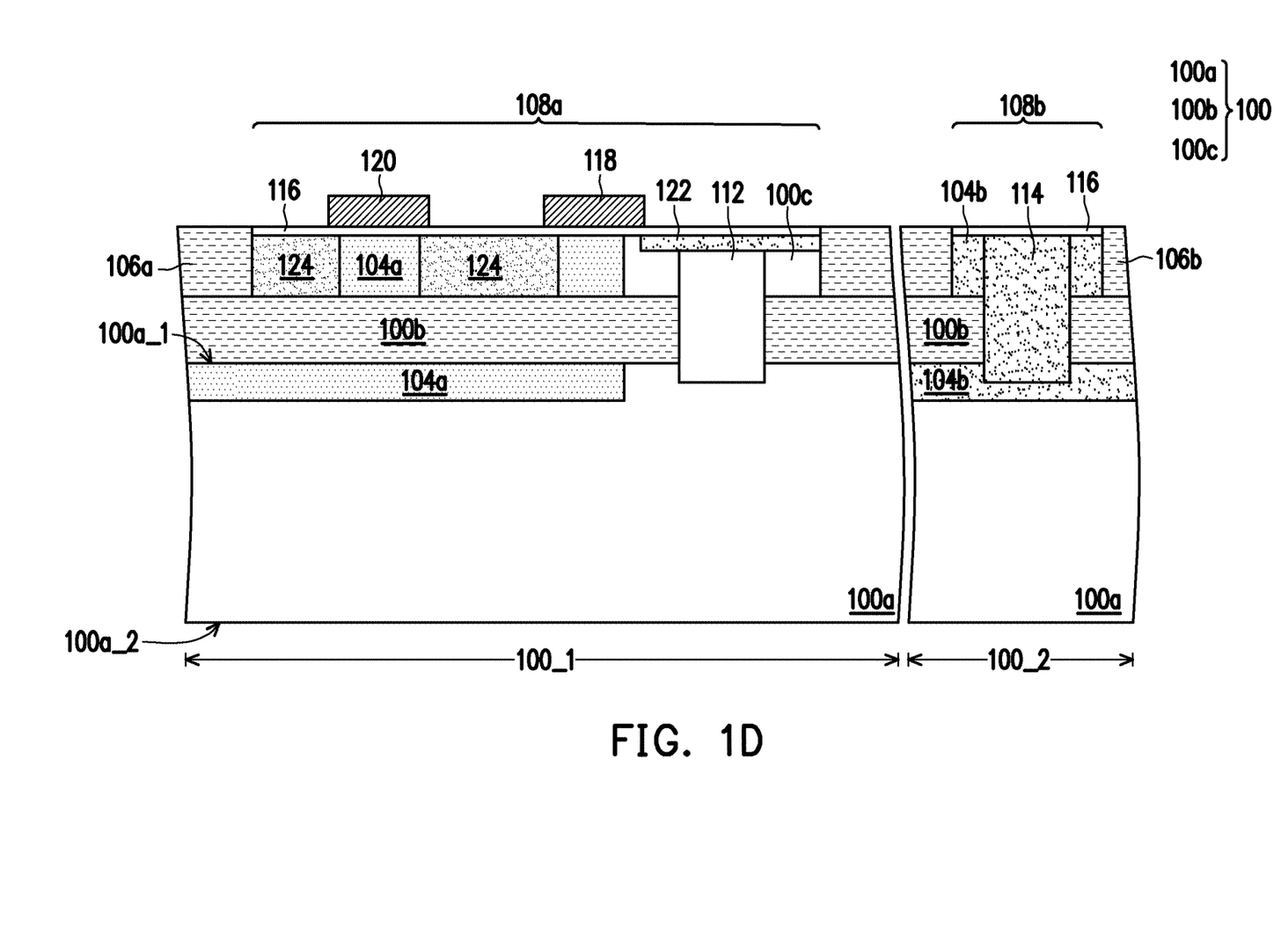

Referring to FIG. 1D, the doped region 122 of the second conductive type is formed at the surfaces of the first silicon layer 100c and the second silicon layer 112 in the first active area 108a. The doped region 122 is used as a pinning layer. The dopant of the second conductive type is implanted into the third silicon layer 114 and the first silicon layer 100c (the doped region 104b) in the second active area 108b, so that the third silicon layer 114 and the first silicon layer 100c (the doped region 104b) in the second active area 108b have the second conductive type. The dopant of the first conductive type is implanted in a part of the doped region 104a in the first active area 108a to form doped regions 124 in the doped region 104a beside the gate 118 and the gate 120. In this way, a transfer transistor and a reset transistor are formed on the first silicon layer 100c in the first active area 108a. The above-mentioned doping steps are well known to those skilled in the art and are not further described herein. In addition, the sequence of the above-mentioned doping steps may be adjusted according to the actual situation, which is not limited by the present invention.

Figure 1E:
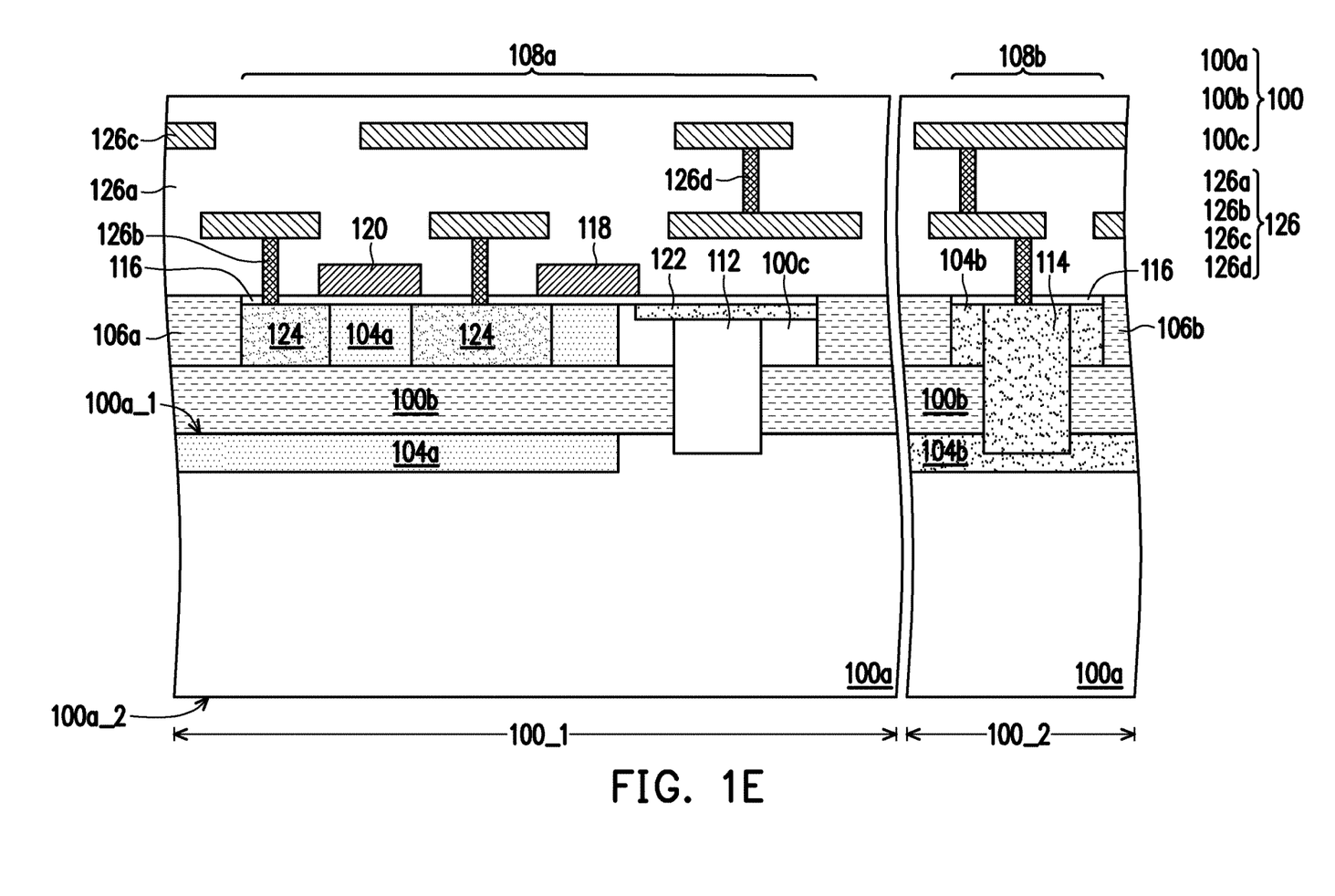

Referring to FIG. 1E, the interconnect structure 126 is formed on the first silicon layer. The interconnect structure 126 is electrically connected to the transfer transistor and the reset transistor, and is electrically connected to the third silicon layer 114 in the second active area 108b. The interconnect structure 126 includes the dielectric layer 126a formed on the third silicon layer 114 and the circuit structure formed in the dielectric layer 126a and electrically connected to the transfer transistor, the reset transistor and the third silicon layer 114. The circuit structure includes the contact plugs 126b, the circuit patterns 126c and the via plugs 126d. The contact plugs 126b connect the lowermost circuit pattern 126c with the transfer, the reset transistor and the third silicon layer 114, and the via plugs 126d connect the circuit patterns 126c of each layer. In the present embodiment, two layers of circuit pattern 126c are shown, but the present invention is not limited thereto. In other embodiments, the interconnect structure 126 may include more or fewer layers of the circuit pattern 126c. The detailed structure and forming method of the interconnect structure 126 are well known to those skilled in the art, and are not further described herein.

Figure 1F:
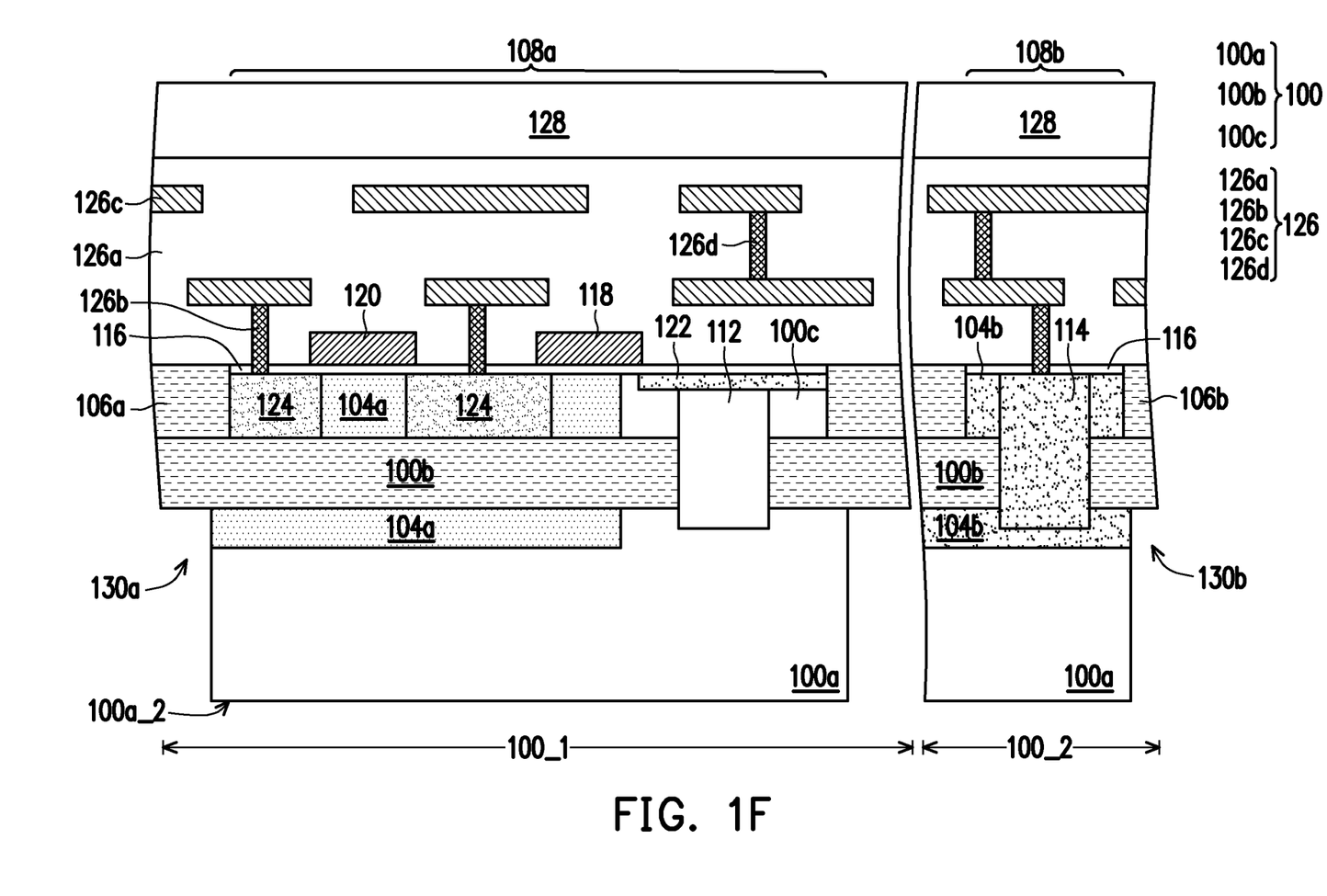

Referring to FIG. 1F, the silicon base 100a is optionally thinned to reduce the thickness of the semiconductor substrate 100 from the second surface 100a_2 of the silicon base 100a. In the present embodiment, a chemical mechanical polishing process is performed on the second surface 100a_2 to remove a part of the substrate 100 to reduce the thickness of the substrate 100. In the present embodiment, the carrier wafer 128 is bonded to the dielectric layer 126a before the thickness of the semiconductor substrate 100 is reduced, but the present invention is not limited thereto.

The trenches 130a are formed in the silicon base 100a in the first region 100_1, and the trench 130b are formed in the silicon base 100a in the second region 100_2. The trenches 130a and the trenches 130b penetrate trough the silicon base 100a to expose the insulating layer 100b. In the present embodiment, the trenches 130a are located directly under the isolation structure 106a, and the trenches 130b are located directly under the isolation structure 106b, but the present invention is not limited thereto.

Figure 1G:
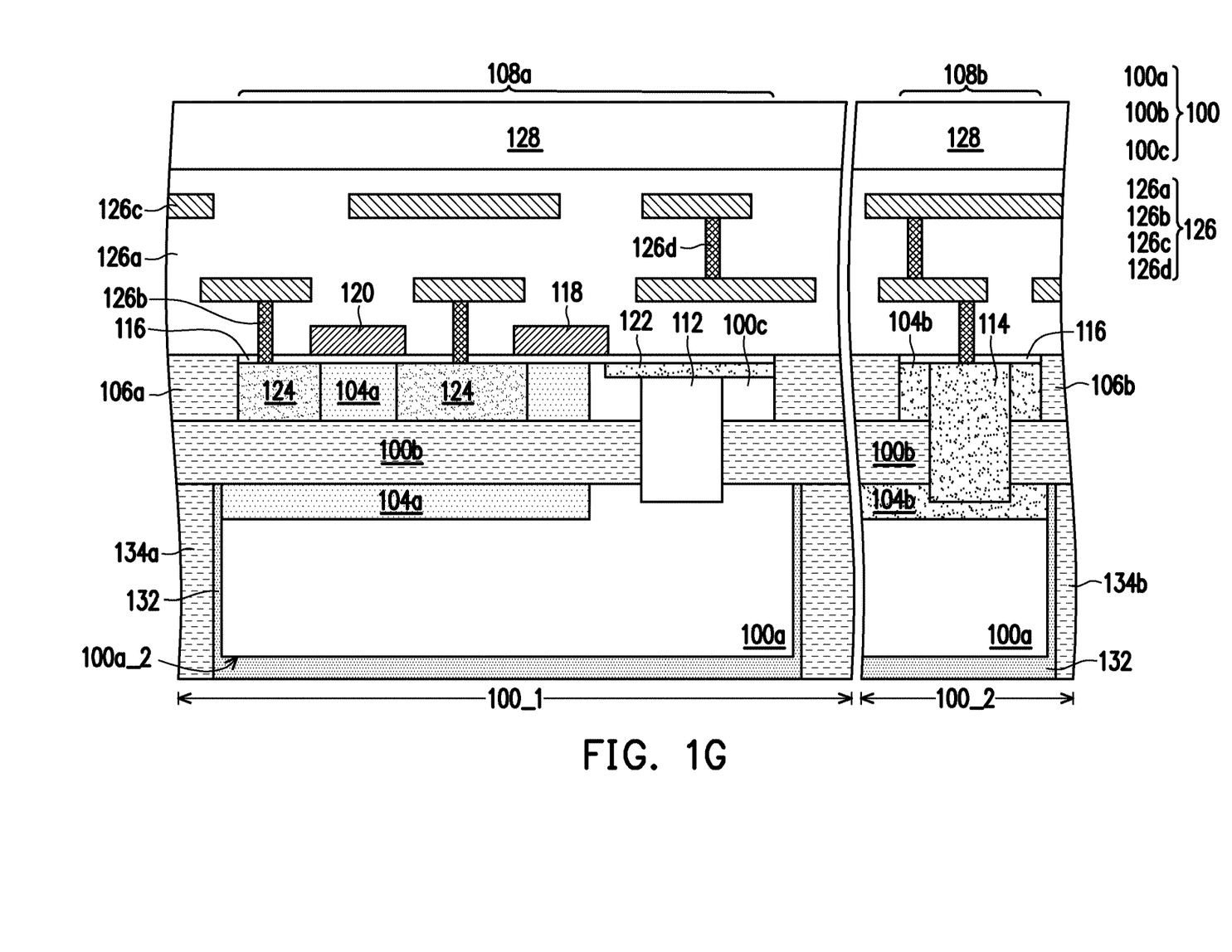

Referring to FIG. 1G, the passivation layer 132 is formed around the silicon base 100a in the first region 100_1 and around the silicon base 100a in the second region 100_2. In the first region 100_1, the passivation layer 132 surrounds the silicon base 100a and is connected to the first doped region 104a in the silicon base 100a. In the second region 100_2, the passivation layer 132 surrounds the silicon base 100a and is connected to the doped region 104b in the silicon base 100a. In one embodiment, the passivation layer 132 may be a doped region of the second conductive type, which is formed by, for example, performing a plasma doping treatment on the exposed surface of the silicon base 100a. Alternatively, in another embodiment, the passivation layer 132 may be a film with high dielectric constant (high-k film), and the forming method of the passivation layer 132 is, for example, a chemical vapor deposition process. In some embodiments, the high-k film is, for example, an aluminum oxide layer, a hafnium oxide layer or a combination thereof, but the present invention is not limited thereto.

The isolation structure 134a is formed in the trenches 130a, and the isolation structure 134b is formed in the trenches 130b. In the present embodiment, the isolation structure 134a and the isolation structure 134b are deep trench isolation (DTI) structures. In this way, the isolation structure 134a is located in the silicon base 100a under the isolation structure 106a and connected to the insulating layer 100b, and the isolation structure 134b is located in the silicon base 100a under the isolation structure 106b and connected to the insulating layer 100b. Therefore, the isolation structure 134a and the isolation structure 134b penetrate through the silicon base 100a. In addition, based on the layout design, the isolation structure 134a and the isolation structure 134b in the silicon base 100a may be designed to surround the entire pixel region. As a result, the adjacent pixel regions may be effectively isolated, thereby effectively to reduce the crosstalk between the adjacent pixel regions. The forming method of the isolation structure 134a and the isolation structure 134b are well known to those skilled in the art, and is not further described herein.

Figure 1H:
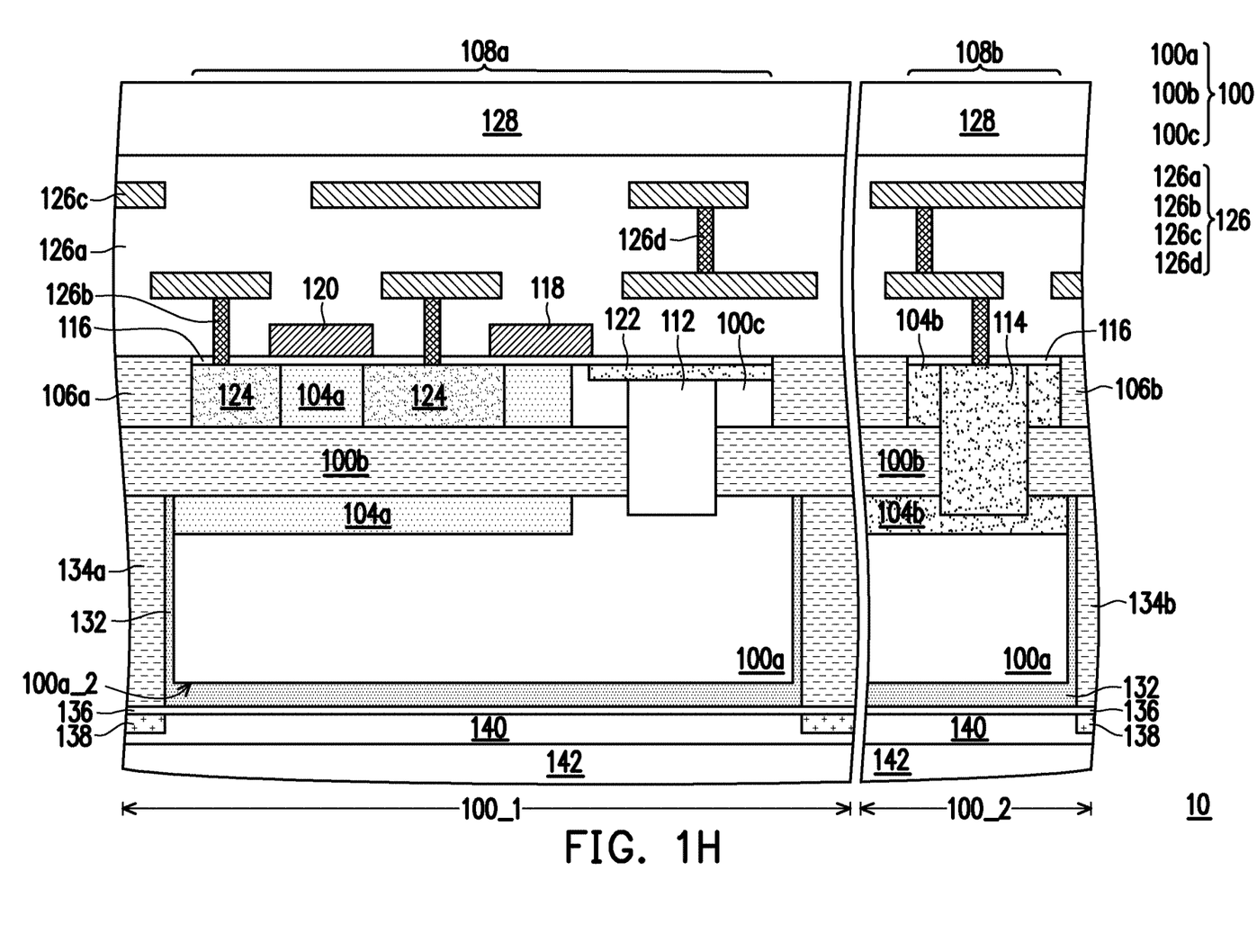

Referring to FIG. 1H, the antireflection layer 136 is formed on the second surface 100a_2 of the silicon base 100. The shielding layer 128 is formed on the antireflection layer 136. In the present embodiment, the shielding layer 138 are not overlapped with the silicon base 100a, but the present invention is not limited thereto. In other embodiments, the shielding layer 138 may be partially overlapped with the silicon base 100a. Then, the color filter layer 140 is formed on the antireflection layer 136. The microlens 142 is formed on the color filter layer 140 to complete the manufacture of the image sensor 10 of the present embodiment.

In the image sensor 10, the silicon base 100a of the semiconductor substrate 100 has the first conductive type and the doped region 104a in the silicon base 100a has the second conductive type, so the silicon base 100a and the doped region 104a constitute a photodiode. In the present embodiment, the photodiode is composed of almost the entire silicon base 100a of the semiconductor substrate 100, so the photodiode may have a relatively large light-receiving area to improve the fill factor of the photodiode, and may have a high potential well capacity. In addition, in the present embodiment, the image sensor 10 is manufactured by using a silicon-on-insulator substrate, so the substrate may have a small parasitic capacitance, and thus the photodiode may have a high conversion gain. In this way, the image sensor 10 may have better pixel performance.

Furthermore, in the image sensor 10, the passivation layer 132 in the second region 100_2 surrounds the silicon base 100a and is connected to the doped region 104b in the silicon base 100a. In this way, the doped region of the second conductive type in the photodiode may be grounded through the third silicon layer 114 in the second region 100_2.

It will be apparent to those skilled in the art that various modifications and variations may be made to the disclosed embodiments without departing from the scope or spirit of the invention. In view of the foregoing, it is intended that the invention covers modifications and variations provided that they fall within the scope of the following claims and their equivalents.

What is claimed is:

1. An image sensor, comprising:
    a silicon base of a first conductive type, having a first surface and a second surface opposite to each other;
    an insulating layer, disposed on the first surface of the silicon base;
    a first silicon layer, disposed on the insulating layer;
    a first isolation structure, disposed in the first silicon layer to define a first active area;
    a first doped region of a second conductive type, disposed in a part of the first silicon layer in the first active area and in a part of the silicon base thereunder;
    a second silicon layer of the first conductive type, disposed in a part of the first silicon layer in the first active region except the first doped region, and extending through the insulating layer into the silicon base;
    a transistor, disposed on the first silicon layer in the first active area;
    an interconnect structure, disposed on the first silicon layer and electrically connected with the transistor;
    a second isolation structure, disposed in the silicon base under the first isolation structure and connected to the insulating layer;
    a passivation layer, disposed between the silicon base and the second isolation structure, surrounding the silicon base, and connected to the first doped region; and
    a microlens, disposed on the second surface of the silicon base.

2. The image sensor of claim 1, wherein the bottom surface of the second silicon layer is not lower than the bottom surface of the first doped region in the silicon base.

3. The image sensor of claim 1, further comprising a second doped region of the second conductive type, disposed at the surface of the second silicon layer.

4. The image sensor of claim 1, wherein the passivation layer comprises a third doped region of the second conductive type.

5. The image sensor of claim 1, wherein the passivation layer comprises an aluminum oxide layer, a hafnium oxide layer or a combination thereof.

6. The image sensor of claim 1, further comprising:
    an antireflection layer, disposed between the silicon base and the microlens; and
    a color filter layer, disposed between the antireflection layer and the microlens.

7. The image sensor of claim 1, further comprising a shielding layer, disposed between the silicon base and the microlens, and partially overlapped with the silicon base.

8. The image sensor of claim 1, wherein the interconnect structure comprises:
    a dielectric layer, disposed on the first silicon layer and covering the transistor and the first isolation structure; and
    a circuit structure, disposed in the dielectric layer and electrically connected with the transistor.

9. The image sensor of claim 1, wherein the first isolation structure further defines a second active area, and the image sensor further comprises:
    a fourth doped region of the second conductive type, disposed in a part of the silicon base under the second active area;
    a third silicon layer of the second conductive type, disposed in the first silicon layer in the second active area and extending through the insulating layer to be connected to the fourth doped region, wherein the bottom surface of the third silicon layer is not lower than the bottom surface of the fourth doped region in the silicon base; and
    a third isolation structure, disposed in the silicon base under the first isolation structure defining the second active area, and connected to the insulating layer,
    wherein the passivation layer is further disposed between the silicon base and the third isolation structure, surrounds the silicon base, and is connected to the fourth doped region.

10. The image sensor of claim 9, wherein the interconnect structure is further electrically connected to the third silicon layer.

11. A manufacturing method of an image sensor, comprising:
    providing a semiconductor substrate, wherein the semiconductor substrate comprises a silicon base of a first conductive type having a first surface and a second surface opposite to each other, an insulating layer on the first surface and a first silicon layer on the insulating layer;
    forming a first doped region of a second conductive type in a part of the first silicon layer and in a part of the silicon base thereunder;
    forming a first isolation structure in the first silicon layer to define a first active area, wherein the first doped region in the first silicon layer is located in the first active area;
    forming a second silicon layer of the first conductive type in a part of the first silicon layer in the first active region except the first doped region, wherein the second silicon layer extends through the insulating layer into the silicon base;

forming a transistor on the first silicon layer in the first active area;

forming an interconnect structure on the first silicon layer, wherein the interconnect structure is electrically connected with the transistor;

forming a second isolation structure in the silicon base under the first isolation structure, wherein the second isolation structure is connected to the insulating layer;

forming a passivation layer between the silicon base and the second isolation structure, wherein the passivation layer surrounds the silicon base and is connected to the first doped region; and forming a microlens on the second surface of the silicon base.

12. The manufacturing method of an image sensor of claim 11, wherein the bottom surface of the second silicon layer is not lower than the bottom surface of the first doped region in the silicon base.

13. The manufacturing method of an image sensor of claim 11, further comprising forming a second doped region of the second conductive type at the surface of the second silicon layer after forming the second silicon layer and before forming the transistor.

14. The manufacturing method of an image sensor of claim 11, wherein the passivation layer comprises a third doped region of the second conductive type.

15. The manufacturing method of an image sensor of claim 11, wherein the passivation layer comprises an aluminum oxide layer, a hafnium oxide layer or a combination thereof.

16. The manufacturing method of an image sensor of claim 11, after forming the passivation layer and before forming the microlens, further comprising:

forming an antireflection layer on the second surface of the silicon base; and forming a color filter layer on the antireflection layer.

17. The manufacturing method of an image sensor of claim 11, after forming the passivation layer and before forming the microlens, further comprising forming a shielding layer on the second surface of the silicon base, wherein the shielding layer is partially overlapped with the silicon base.

18. The manufacturing method of an image sensor of claim 11, wherein the first isolation structure further defines a second active area, and further comprising:

forming a fourth doped region of the second conductive type in a part of the silicon base under the second active area;

forming a third silicon layer of the second conductive type in the first silicon layer in the second active area, wherein the third silicon layer extends through the insulating layer to connect to the fourth doped region, and the bottom surface of the third silicon layer is not lower than the bottom surface of the fourth doped region in the silicon base; and forming a third isolation structure in the silicon base under the first isolation structure defining the second active area, wherein the third isolation structure is connected to the insulating layer, wherein the passivation layer is further formed between the silicon base and the third isolation structure, surrounds the silicon base, and is connected to the fourth doped region.

19. The manufacturing method of an image sensor of claim 11, wherein the interconnect structure is further electrically connected with the third silicon layer.

20. The manufacturing method of an image sensor of claim 11, after forming the interconnect structure and before forming the second isolation structure and the passivation layer, further comprising thinning the silicon base.

* * * * *